ated under 35
United States Patent
Foroudi

(10) Patent No.: US 10,374,602 B1
(45) Date of Patent: Aug. 6, 2019

(54) TRANSISTOR LINEARIZATION TECHNIQUES

(71) Applicant: Analog Devices, Inc., Norwood, MA (US)

(72) Inventor: Omid Foroudi, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/878,280

(22) Filed: Jan. 23, 2018

(51) Int. Cl.
*H03K 17/687* (2006.01)

(52) U.S. Cl.
CPC ... *H03K 17/687* (2013.01); *H03K 2217/0054* (2013.01)

(58) Field of Classification Search
CPC .................... H03K 17/687; H03K 2217/0054
See application file for complete search history.

(56) References Cited

U.S. PATENT DOCUMENTS

| | | | |
|---|---|---|---|
| 8,400,205 B2 * | 3/2013 | Foroudi | H03H 11/245 327/308 |
| 8,547,156 B2 | 10/2013 | Foroudi | |
| 2003/0016072 A1 * | 1/2003 | Ramakrishnan | H03K 17/162 327/434 |

* cited by examiner

*Primary Examiner* — Jung Kim
(74) *Attorney, Agent, or Firm* — Schwegman Lundberg & Woessner, P.A.

(57) ABSTRACT

Techniques for linearizing a field effect transistor (FET) are provided. In an example, a method can include averaging a voltage at a drain node of the FET and a voltage at a source node of the FET to provide an average voltage, and applying the average voltage to a gate node of the FET.

20 Claims, 3 Drawing Sheets

TRANSISTOR LINEARIZATION TECHNIQUES

BACKGROUND

Transistors can be used as programmable, adjustable resistors. However, the response of the transistor in the ohmic region can be non-linear due to various voltages applied to terminals of the transistor.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Field-effect transistors (FETs) can be used as adjustable resistors where a control voltage applied to the gate node of the FET can control the resistance between the drain node of the FET and the source node of the FET. However, for a given control voltage present at the gate of the FET, the resistance can change because the voltage between the source and drain can also affect the resistance of the FET. For example, current (Id) through a FET can be given by, $$I_d = \mu C_{ox}\frac{W}{L}\left(v_g - v_t - \left(\frac{v_d + v_s}{2}\right)\right)v_{ds}, \quad \text{Eq. 1}$$

where, μ is the mobility, $C_{ox}$ is the capacitance per unit area of the gate oxide, W is the width of the gate, L is the length of the gate, $v_g$ is the voltage applied at the gate, $v_t$ is the threshold voltage of the FET, $v_d$ is the voltage at the drain node of the FET, $v_s$ is the voltage at the source node of the FET, and $v_{ds}$ id the voltage across the drain and source nodes. In operation, $v_g$ can receive a control voltage ($V_{ctl}$) to turn the FET on and off and to control the resistance. It has been recognized, that if the voltage at the gate also include an average of the voltages applied to the drain and source nodes with proper polarity, such that, $$v_g = V_{ctl} + \left(\frac{v_d + v_s}{2}\right), \quad \text{Eq. 2}$$

the relationship of the resistance of the FET and the control voltage can be quite stable even with changing voltages at the drain and source nodes. For example, Substituting Eq. 2 into Eq. 1, the current through the FET can be, $$I_d = \mu C_{ox}\frac{W}{L}(V_{ctl} - v_t)v_{ds}, \quad \text{Eq. 3}$$

which can provide a very linear relationship between $V_{ds}$ and $I_d$, and can make the resistance across the FET independent of the voltages applied to the drain and source nodes of the FET. In certain examples, where the FET is operating at high frequencies, the average of the voltages applied to the drain and source nodes, $$\left(\frac{v_d + v_s}{2}\right),$$

can be added to the gate node, along with the control voltage ($V_{ctl}$), by connecting the control voltage to the gate node with an isolation resistor ($R_{iso}$). In such an arrangement, an isolation resistor can work in cooperation with the parasitic capacitances ($C_{gs}$, $C_{gd}$) between the source and gate ($C_{gs}$), and between the drain and the gate ($C_{gd}$), to apply an average of the voltages present at the drain and the source nodes to the gate node. Unfortunately, the beneficial effect deteriorates as the frequency of operation falls below the corner frequency ($f_c$) defined by the parasitic capacitances and the isolation resistor, where, $$f_c = \frac{1}{2\pi R_{iso}(C_{gs} + C_{gd})}. \quad \text{Eq. 4}$$

Figure 1:
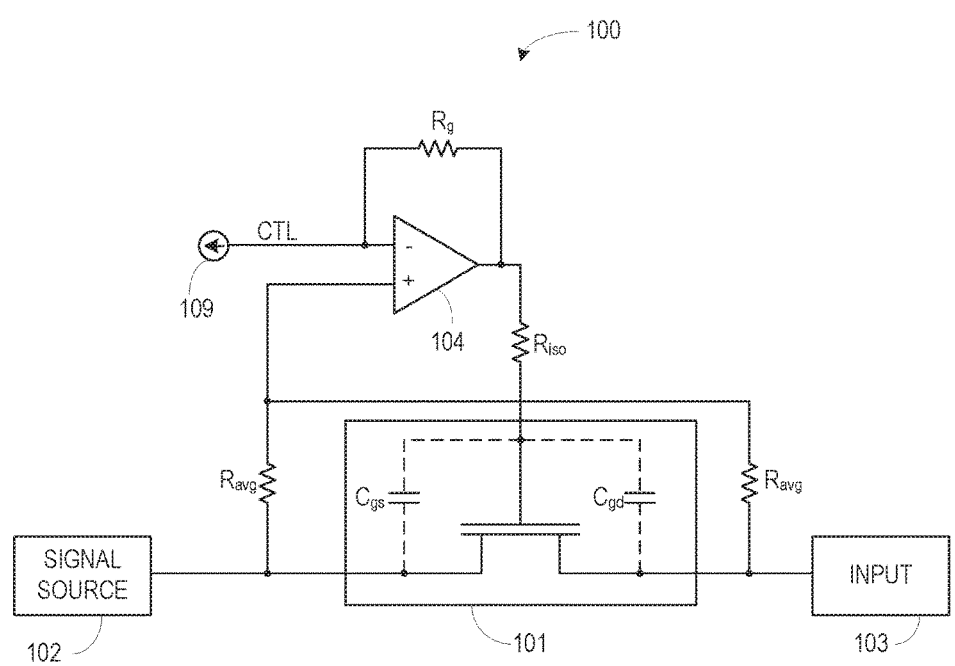
FIG. 1 illustrates generally an example circuit 100 for extending the linear response of a field-effect transistor.

FIG. 1 illustrates generally an example circuit 100 for improving the linear response of a FET below the corner frequency defined by the parasitic capacitances of the FET. The circuit 100 can include the FET 101, a signal source 102, an input circuit 103, an amplifier 104, and a number of resistors (Rg, Riso, Ravg). In certain examples, the signal source can include a sensor. In various examples, the input circuit can include a multiplexer or an analog-to-digital converter. In certain examples, the FET 101 can receive a control signal (CTL) and can selectively couple the signal provided by the signal source 102 to the input circuit 103. The state of the control signal (CTL) can control the selective coupling of the FET 101, as well as, the resistance across the source and drain terminals of the FET. In some examples, the control signal (CTL) can be provided by a controller of the circuit 100. In some examples, the input circuit 103 can include the controller.

Two resistors (Ravg) can couple the source node and the drain node to a non-inverting input of the amplifier. A gain resistor (Rg) can couple an inverting input of the amplifier with the output of the amplifier. An isolation resistor (Riso) can couple the output of the amplifier with the gate node of the FET. The control signal (CNTL) can be received at the inverting input of the amplifier. In certain example, a source of the control signal can be a current source 109, such as one that provides a signal with a magnitude of $V_{CNTL}/Rg$, where $V_{CNTL}$ is a control voltage to be applied to the gate node of the FET. The speed of the amplifier can be higher than the corner frequency discussed above to maintain the linearizing compensation up to the corner frequency.

In some examples, the signal provided by the signal source can be an analog signal having one or more frequency components and that can vary the voltage provided on the source and drain nodes of the FET 101. As discussed above, the voltages at the source and drain nodes of the FET 101 can affect the on-resistance of the FET for a given voltage at the gate node. If the on-resistance of the FET changes when the FET is coupling the signal source to the input, distortion can be introduced to the signal provided by the signal source. As a result, the signal received by the input circuit 103 may not be a true representation of the signal generated by the signal source. The compensation provided by applying the average of the voltages at the drain and source nodes of the FET 101 can stabilize the resistance of the FET 101 for a given control signal and can help provide a true representation of the signal provided by the signal source 102 to the input circuit 103.

In some situations, for example when the signal generated by the signal source is a high frequency signal, parasitic capacitances, in cooperation with an isolation resistance, can apply an average voltage of the voltages applied to the source and drain nodes to the gate node. At high frequency, the resistance of the FET can be stabilized for a given control signal applied to the gate, and can provide a substantially linear relationship between the control signal and the resistance of the FET for a range of values of the control signal. Below a corner frequency defined by the parasitic capacitances and the isolation resistor (Riso), the effects of the voltages at the source and drain nodes of the FET deteriorate the stability of the resistance of the FET 101 as voltage changes at the drain and source nodes of the FET 101. Such stabilization can assist in making the resistance of the FET 101 independent of the signal applied to the drain and source nodes of the FET 101 such that the signal received at the input circuit 103, or input device, is a linear representation of the signal received from the signal source 102.

Figure 2:
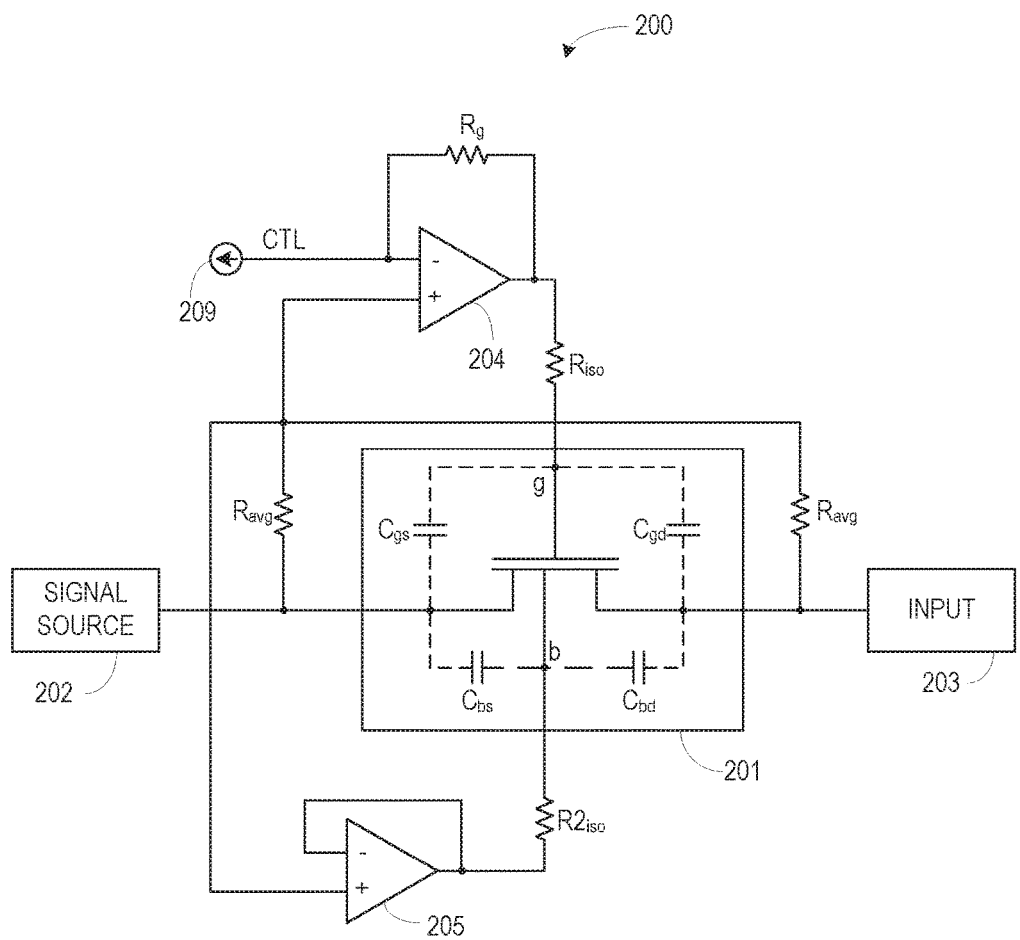
FIG. 2 illustrates generally an example circuit 200 for extending the linear response of a FET.

FIG. 2 illustrates generally an example circuit 200 for improving the linear response of a FET, having a backgate node, below the corner frequency defined by the parasitic capacitances of the FET. The circuit includes the FET 201, a signal source 202, an input circuit 203, a first amplifier 204, a second amplifier 205, and a number of resistors (Rg, Riso, Ravg). In certain examples, the FET can include a gate (g) and a backgate (b). In certain examples, the backgate can be modulated to assist in linearizing the resistance of the FET with respect to the control voltage received at the gate (g). The first amplifier can be employed as discussed above with respect to FIG. 1 to stabilize the the resistance of the FET between the drain and source nodes for given control signal (CTL) level. In certain examples, a source of the control signal can be a current source 209, or controller, such as one that provides a signal with a magnitude of $V_{CNTL}/Rg$, where $V_{CNTL}$ is a control voltage to be applied to the gate node of the FET.

The second amplifier can be similarly employed to assist the stabilization the resistance of the FET between the drain and source nodes via the backgate (b). In certain examples, the output of the second amplifier can be coupled to the backgate (b) via a second isolation resistor (R2iso). The set of two resistors (Ravg) can couple the source node and the drain node to a non-inverting input of the second amplifier. The second amplifier can be arranged in a voltage follower mode to apply the average of the voltages present at the drain and source nodes of the FET to the backgate (b). Applying an average of the voltages at the drain and source nodes of the FET 201 to the gate (g) and backgate (b) of the FET 201 can assist in making the resistance of the FET 201 independent of the signal applied to the drain and source nodes such that the signal received at the input circuit 203, or input device, is an improved linear representation of the signal received from the signal source 202.

Figure 3:
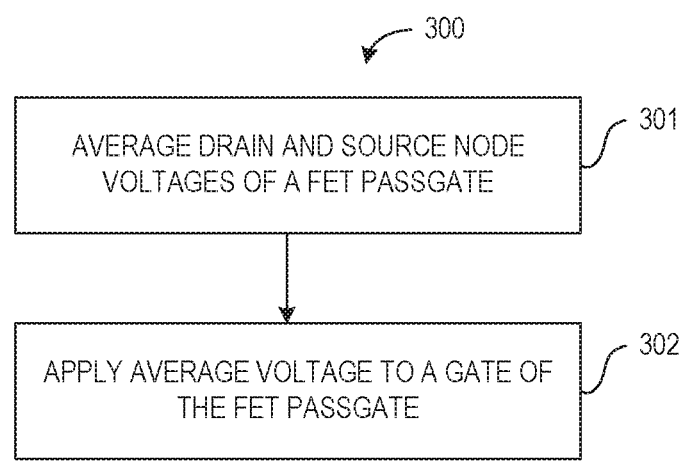
FIG. 3 illustrates generally an example method of operating a circuit for linearizing an adjustable resistance of a FET.

FIG. 3 illustrates generally a flowchart of an example method 300 of linearizing a FET passgate. At 301, the voltage at a drain node of the FET passgate can be averaged with the voltage at the source of the FET passgate to provide an average voltage. At 302, the average voltage can be applied to the gate of the FET passgate. In certain examples, the average voltage can be determined using a voltage divider employing two resistors, having substantially the same resistance, coupled in series between the source and drain of the FET passgate. The average voltage can be present at the node connecting the two resistances together. The FET passgate can function as a programmable resistor and can receive a control signal at the gate to program the resistance of the FET passgate as the FET of the FET passgate operates in the ohmic region. In certain examples, the control signal and the average voltage can be summed using an amplifier having an output coupled to the gate. In some example, an isolation resistor can be used to couple the output of the amplifier to the gate. As discussed above, applying the average voltage to the gate of the FET can stabilize the resistance of the FET when the voltage at the drain and source nodes vary. Such stabilization can assist in making the resistance of the FET independent of the signal applied to the drain and source nodes such that the signal received at the input circuit or input device is a linear representation of the signal received from the signal source. In some application, the FET can include a backgate and additional linearization can be achieved by applying the average voltage to the backgate. In certain examples, a second amplifier employed in a voltage follower configuration can be used to apply the average voltage to the backgate. In some examples, a second isolation resistance can be used to couple the output of the second amplifier with the backgate. In certain applications, the method 300 can complement high frequency linearization of the FET accomplished using parasitic capacitance of the FET by extending the linearization to operation at frequencies lower than corner frequencies defined by the parasitic capacitances.

VARIOUS NOTES & EXAMPLES

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, the terms "including" and "comprising" are open-ended, that is, a system, device, article, composition, formulation, or process that includes elements in addition to those listed after such a term are still deemed to fall within the scope of subject matter discussed. Moreover, such as may appear in a claim, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of a claim. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. The following aspects are hereby incorporated into the Detailed Description as examples or embodiments, with each aspect standing on its own as a separate embodiment, and it is contemplated that such embodiments can be combined with each other in various combinations or permutations.

What is claimed is:

1. A circuit for linearizing an adjustable resistance of a field effect transistor (FET), the circuit comprising:
    the FET; and
    a differential amplifier configured to apply a representation of a voltage of a drain of the FET and a representation of a voltage of a source of the FET to a gate of the FET by mixing the representations at a common node different from the drain and the source and applying the mixed representations as an input of the amplifier.

2. The circuit of claim 1, wherein an average voltage of the voltage of the drain and the voltage of the source provides the representation of the voltage of the drain and the representation of the voltage of the source.

3. The circuit of claim 1, wherein the FET is configured to receive a control voltage at the gate, and to provide a resistance between the source and the drain based on the control voltage.

4. The circuit of claim 3, wherein a resistance of the FET is independent of a signal received at the drain or the source.

5. The circuit of claim 2, including a first resistor configured to couple the source to a first input of the amplifier.

6. The circuit of claim 5, including a second resistor configured to couple the drain to the first input of the amplifier.

7. The circuit of claim 6, including a third resistor configured to couple an output of the amplifier to the gate of the FET.

8. The circuit of claim 7, including a capacitor circuit configured to apply the average voltage to the gate of the FET during high frequency operation of the FET.

9. The circuit of claim 8, wherein the capacitor circuit includes parasitic capacitances of the FET.

10. The circuit of claim 1, including:
    a second differential amplifier configured to apply an average voltage to a back gate of the FET;
    a first resistor configured to couple the source to a first input of the second amplifier; and
    a second resistor configured to couple the drain to the first input of the second amplifier;
    wherein the average voltage is an average of a voltage of the drain of the FET and a voltage of the source of the FET.

11. The circuit of claim 10, wherein a resistance of the FET is independent of a signal received at the drain or the source.

12. The circuit of claim 10, including a third resistor configured to couple an output of the second amplifier to the back gate of the FET.

13. The circuit of claim 12, including a fourth resistor configured to couple an output of the amplifier to the gate of the FET.

14. A circuit for linearizing an adjustable resistance of a field effect transistor (FET), the circuit comprising:
    the FET;
    a differential amplifier configured to apply a representation of a voltage of a drain of the FET and a representation of a voltage of a source of the FET to a gate of the FET;
    a first resistor configured to couple the source to a first input of the amplifier;
    a second resistor configured to couple the drain to the first input of the amplifier; and
    wherein an average voltage of the voltage of the drain and the voltage of the source provides the representation of the voltage of the drain and the representation of the voltage of the source.

15. The circuit of claim 14, including a third resistor configured to couple an output of the amplifier to the gate of the FET.

16. The circuit of claim 15, including a capacitor circuit configured to apply the average voltage to the gate of the FET during high frequency operation of the FET.

17. The circuit of claim 16, wherein the capacitor circuit includes parasitic capacitances of the FET.

18. A method for linearizing a Field Effect Transistor (FET), the method comprising:
    coupling a first signal at a source node of the FET to a first input of a differential amplifier via a first resistor;
    coupling a second signal at a drain node of the FET to the first input of the amplifier via a second resistor;
    averaging a voltage of the first signal with a voltage of the second signal via the amplifier to provide an average voltage; and
    applying the average voltage to a gate node of the FET.

19. The method of claim 18, wherein the applying the average voltage includes summing a control voltage with the average voltage to provide a summed voltage; and
    applying the summed voltage to the gate node of the FET.

20. The method of claim 19, wherein the applying the summed voltage to the gate node includes applying the summed voltage to the gate node via a first isolation resistor.

* * * * *